(12) United States Patent
Hasebe et al.

(10) Patent No.: US 7,959,733 B2
(45) Date of Patent: Jun. 14, 2011

(54) FILM FORMATION APPARATUS AND METHOD FOR SEMICONDUCTOR PROCESS

(75) Inventors: Kazuhide Hasebe, Minamialps (JP);
Pao-Hwa Chou, Kai (JP); Chaeho Kim, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/504,454

(22) Filed: Jul. 16, 2009

(65) Prior Publication Data

US 2009/0275150 A1 Nov. 5, 2009

Related U.S. Application Data

(62) Division of application No. 11/155,629, filed on Jun. 20, 2005, now abandoned.

(30) Foreign Application Priority Data

Jun. 21, 2004 (JP) ................................. 2004-182361
May 13, 2005 (JP) ................................. 2005-141401

(51) Int. Cl.
*C23C 16/00* (2006.01)
*C30B 28/14* (2006.01)
*H01L 21/00* (2006.01)
*H01L 21/22* (2006.01)

(52) U.S. Cl. ........... 118/715; 118/723 VE; 118/723 ER; 118/723 MP; 117/89; 117/206; 427/255.32; 427/255.38; 427/255.393; 428/698; 438/491; 438/495; 438/566; 438/784

(58) Field of Classification Search ................... 118/715, 118/723 VE, 723 ER, 723 MP; 117/89, 206; 427/255.32, 255.38, 255.393; 428/698; 438/491, 495, 566, 784

See application file for complete search history.

(56) References Cited

U.S. PATENT DOCUMENTS

| | | | | | |
|---|---|---|---|---|---|
| 3,605,785 | A | * | 9/1971 | Dobritz | 137/101 |
| 3,841,344 | A | * | 10/1974 | Slack | 137/88 |
| 4,100,310 | A | | 7/1978 | Ura et al. | |
| 4,279,670 | A | * | 7/1981 | Steele | 117/89 |
| 4,661,427 | A | * | 4/1987 | Kanai | 430/57.7 |
| 4,683,147 | A | | 7/1987 | Eguchi et al. | |
| 4,773,355 | A | * | 9/1988 | Reif et al. | 118/719 |
| 5,487,346 | A | * | 1/1996 | Taylor | 111/127 |
| 5,654,230 | A | * | 8/1997 | Jintate et al. | 438/684 |

(Continued)

FOREIGN PATENT DOCUMENTS

JP 6-35544 2/1994

(Continued)

*Primary Examiner* — Walter L Lindsay, Jr.
*Assistant Examiner* — Ron Pompey
(74) *Attorney, Agent, or Firm* — Oblon, Spivak, McClelland, Maier & Neustadt, L.L.P.

(57) ABSTRACT

A film formation apparatus for a semiconductor process includes a source gas supply circuit to supply into a process container a source gas for depositing a thin film on target substrates, and a mixture gas supply circuit to supply into the process container a mixture gas containing a doping gas for doping the thin film with an impurity and a dilution gas for diluting the doping gas. The mixture gas supply circuit includes a gas mixture tank disposed outside the process container to mix the doping gas with the dilution gas to form the mixture gas, a mixture gas supply line to supply the mixture gas from the gas mixture tank into the process container, a doping gas supply circuit to supply the doping gas into the gas mixture tank, and a dilution gas supply circuit to supply the dilution gas into the gas mixture tank.

12 Claims, 3 Drawing Sheets

U.S. PATENT DOCUMENTS

| | | | |
|---|---|---|---|
| 5,925,188 A * | 7/1999 | Oh ................................ | 118/715 |
| 6,630,201 B2 | 10/2003 | Chiang et al. | |
| 6,846,516 B2 * | 1/2005 | Yang et al. ............... | 427/255.32 |
| 6,864,507 B2 | 3/2005 | Yokogawa et al. | |
| 6,913,031 B2 * | 7/2005 | Nawata et al. .................. | 137/12 |
| 6,962,859 B2 | 11/2005 | Todd et al. | |
| 7,063,097 B2 | 6/2006 | Arno et al. | |
| 7,084,078 B2 * | 8/2006 | Ahn et al. ..................... | 438/785 |
| 7,125,815 B2 | 10/2006 | Vaartstra | |
| 2002/0106846 A1 * | 8/2002 | Seutter et al. ................. | 438/200 |

FOREIGN PATENT DOCUMENTS

| | | |
|---|---|---|
| JP | 6-26247 | 4/1994 |
| JP | 6-216114 | 8/1994 |
| JP | 2000-235951 | 8/2000 |
| JP | 2003-282566 | 10/2003 |

\* cited by examiner

FILM FORMATION APPARATUS AND METHOD FOR SEMICONDUCTOR PROCESS

CROSS-REFERENCE TO RELATED APPLICATIONS

This application is a divisional application of U.S. application Ser. No. 11/155,629 filed Jun. 20, 2005, is based upon and claims the benefit of priority from prior Japanese Patent Applications No. 2004-182361, filed Jun. 21, 2004; and No. 2005-141401, filed May 13, 2005, the entire contents of both of which are incorporated herein by reference.

BACKGROUND OF THE INVENTION

1. Field of the Invention

The present invention relates to a film formation apparatus and method for a semiconductor process for forming a thin film doped with an impurity (dopant), such as phosphorous (P) or boron (B), on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, oxidation, diffusion, reformation, annealing, and etching. As CVD (Chemical Vapor Deposition) used as a film formation process, there is a method of simultaneously supplying a source gas for film formation and a doping gas for doping the deposition film with an impurity. Jpn. Pat. Appln. KOKAI Publication No. 2003-282566 discloses a CVD method of this kind performed in a vertical heat processing apparatus. According to this method, a number of semiconductor wafers are accommodated at intervals in the vertical direction within a vertical process container. Then, a film formation gas and a doping gas containing an impurity are supplied into the process container while the wafers are being heated. As a consequence, a thin film is deposited on the wafers, while being doped with the impurity. For example, in a process where poly-crystalline silicon doped with phosphorous is deposited, $PH_3$ gas is used as a doping gas.

Where a doping gas of this kind is a material having a high vapor pressure, the doping gas can be supplied in a pure state from a storage tank into a process container at a controlled flow rate. However, in general, doping gases of this kind have a very low vapor pressure. Accordingly, where a doping gas in a pure state is supplied into a process container, it cannot diffuse sufficiently, thereby resulting in a less uniform doping distribution.

For this reason, in general, where a doping gas of this kind is supplied, this doping gas is diluted in advance to, e.g., about 1% by an inactive gas, such as $N_2$, and is stored in a storage cylinder. When used, this diluted 1% doping gas is discharged from the storage cylinder at a controlled flow rate, and is supplied into a process container with a high diffusion rate. In this case, i.e., where the diluted doping gas is supplied from the storage cylinder into the process container, the gas flow rate per unit time becomes larger by that much corresponding to dilution. As a consequence, the doping gas can swiftly and uniformly diffuse in a short time within the process container, which has a relatively large volume.

However, in this case, as described above, the consumption (outflow) per unit time of the diluted doping gas from the storage cylinder is very high. As a consequence, the storage cylinder needs to be replaced with a new one in a relatively short time, thereby resulting in a low productivity and thus a low throughput. Particularly, as the wafer size increases from 8 inches to 12 inches (300 mm), the volume of batch-type process containers greatly increases. Under the circumstances, it has become more necessary for a doping gas being supplied to swiftly and uniformly diffuse within a process container while maintaining high throughput of the process.

BRIEF SUMMARY OF THE INVENTION

An object of the present invention is to increase the diffusion rate of a doping gas within a process container, while decreasing the exchange frequency of a doping gas source, thereby improving the productivity or throughput in a film formation apparatus and method for a semiconductor process.

According to a first aspect of the present invention, there is provided a film formation apparatus for a semiconductor process, comprising:

a process container configured to accommodate a plurality of target substrates stacked at intervals;

a support member configured to support the target substrates inside the process container;

a heater configured to heat the target substrates inside the process container;

an exhaust system configured to exhaust gas inside the process container;

a source gas supply circuit configured to supply a source gas into the process container, the source gas being for depositing a thin film on the target substrates;

a mixture gas supply circuit configured to supply a mixture gas into the process container, the mixture gas containing a doping gas for doping the thin film with an impurity and a dilution gas for diluting the doping gas; and a control section configured to control an operation of the apparatus including the mixture gas supply circuit, wherein the mixture gas supply circuit comprises a gas mixture tank disposed outside the process container and configured to mix the doping gas with the dilution gas to form the mixture gas, a mixture gas supply line configured to supply the mixture gas from the gas mixture tank into the process container, a doping gas supply circuit configured to supply the doping gas into the gas mixture tank, and a dilution gas supply circuit configured to supply the dilution gas into the gas mixture tank.

According to a second aspect of the present invention, there is provided a film formation method for a semiconductor process, comprising:

heating a plurality of target substrates stacked at intervals inside a process container;

supplying a source gas into the process container, the source gas being for depositing a thin film on the target substrates; and supplying a mixture gas from a gas mixture tank disposed outside the process container into the process container, while supplying a doping gas for doping the thin film with an impurity and a dilution gas for diluting the doping gas into the gas mixture tank to form the mixture gas.

According to a third aspect of the present invention, there is provided a computer readable medium containing program instructions for execution on a processor, which, when executed by the processor, cause a film-formation apparatus for a semiconductor process to execute heating a plurality of target substrates stacked at intervals inside a process container;

supplying a source gas into the process container, the source gas being for depositing a thin film on the target substrates; and supplying a mixture gas from a gas mixture tank disposed outside the process container into the process container, while supplying a doping gas for doping the thin film with an impurity and a dilution gas for diluting the doping gas into the gas mixture tank to form the mixture gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will now be described with reference to the accompanying drawings. In the following description, the constituent elements having substantially the same function and arrangement are denoted by the same reference numerals, and a repetitive description will be made only when necessary.

Figure 1:
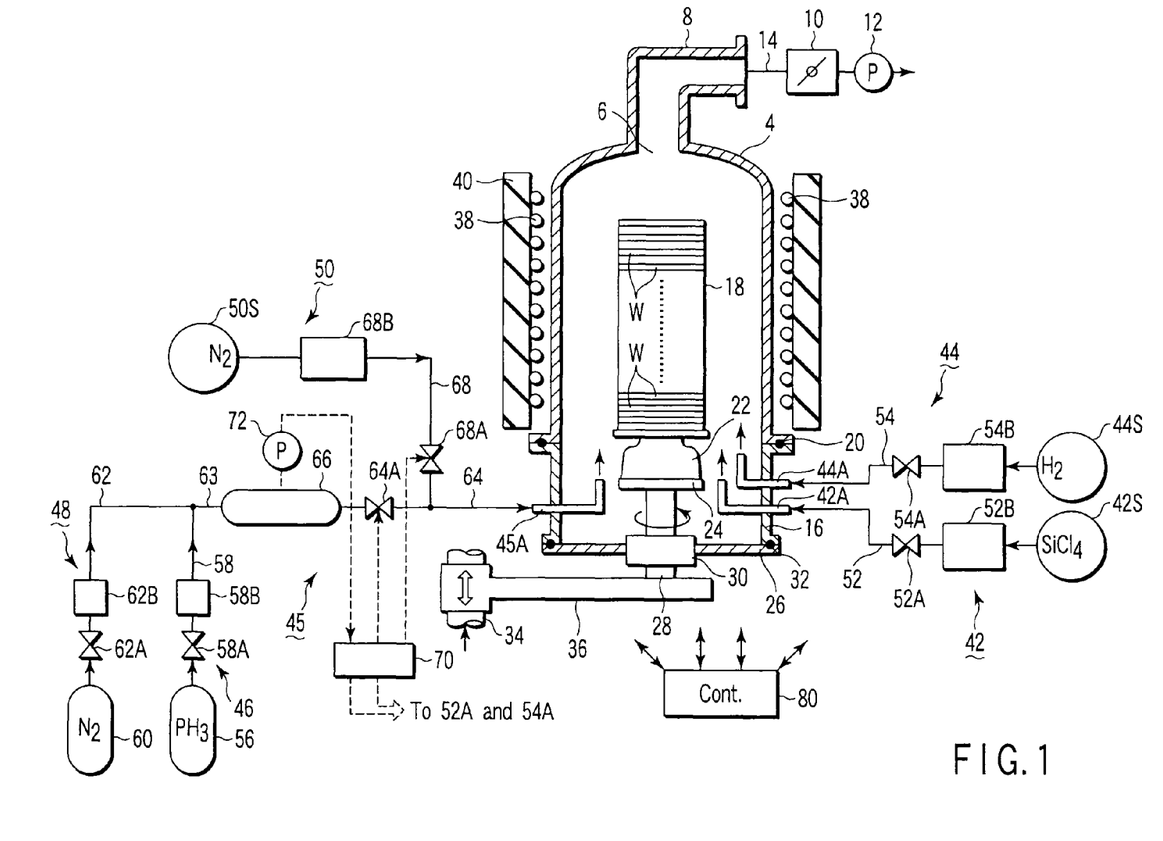
FIG. 1 is a structural view showing a vertical film formation apparatus (CVD apparatus) according to an embodiment of the present invention.

FIG. 1 is a structural view showing a vertical film formation apparatus (CVD apparatus) according to an embodiment of the present invention. As shown in FIG. 1, the film formation apparatus 2 includes a vertical process container 4, which is cylindrical and opened at the bottom. The process container 4 is made of, e.g., quartz, which is high in heat resistance. An exhaust port 6 is formed at the top of the process container 4. The exhaust port 6 is connected to, e.g., an exhaust nozzle 8 laterally bent at right angles. The exhaust nozzle 8 is connected to an exhaust system 14 including a pressure control valve 10 and a vacuum pump 12, provided thereon. The interior of the process container 4 is vacuum-exhausted by the exhaust section 14.

The bottom of the process container 4 is supported by a cylindrical manifold 16 made of, e.g., stainless steel. A sealing member 20, such as an O-ring, is interposed between the bottom of the process container 4 and manifold 16 to keep this portion airtight. The manifold 16 has a port at the bottom, through which a wafer boat 18 is loaded and unloaded. The wafer boat 18 is made of quartz, and functions as holding means for holding semiconductor wafers W at intervals in the vertical direction. In this embodiment, the wafer boat 18 can support, e.g., 50 to 100 wafers W each having a diameter of 300 mm, essentially at regular intervals in the vertical direction. The manifold 16 may be made of quartz and thus integrally formed with the process container 4.

The wafer boat 18 is placed on a table 24 through a heat-insulating cylinder 22 made of quartz. The table 24 is supported on the top of a rotary shaft 28, which penetrates a lid 26 used for opening/closing the bottom port of the manifold 16. The portion of the lid 26 where the rotary shaft 28 penetrates is provided with, e.g., a magnetic-fluid seal 30, so that the rotary shaft 28 is rotatably supported in an airtightly sealed state. A seal member 32, such as an O-ring, is interposed between the periphery of the lid 26 and the bottom of the manifold 16, so that the interior of the process chamber 4 can be kept sealed.

The rotary shaft 28 is attached at the distal end of an arm 36 supported by an elevating mechanism 34, such as a boat elevator. The elevating mechanism 34 moves the wafer boat 18 and lid 26 up and down integratedly. The table 24 may be fixed to the lid 26, so that the wafer boat 18 is not rotated in processing wafers W.

A heater 38 formed of carbon wires (for example, see Jpn. Pat. Appln. KOKAI Publication No. 2003-209063) is disposed to surround the process container 4. The heater 38 is arranged to heat the atmosphere within the process container 4 so as to heat up the semiconductor wafers W. The carbon wire heater is suitable for a case where processes are serially performed, as described later, because it can realize a clean process and has good characteristics for increasing and decreasing the temperature. The heater 38 is surrounded by a thermal insulator 40 to ensure thermal stability. The manifold 16 is connected to several gas supply circuits to supply various gases into the process container 4.

More specifically, the manifold 16 is connected to a source gas supply circuit 42, deoxidizing gas supply circuit 44, and mixture gas supply circuit 45. The gas supply circuits 42, 44, and 45 have gas nozzles 42A, 44A, and 45A, respectively. Each of the gas nozzles 42A, 44A, and 45A penetrates the sidewall of the manifold 16 and is bent at right angles to direct the distal end upward.

The source gas supply circuit 42 is arranged to supply a source gas, for depositing a thin film on the wafers, into the process container 4. The deoxidizing gas supply circuit 44 is arranged to supply a deoxidizing gas, for promoting decomposition of the source gas, into the process container 4. The mixture gas supply circuit 45 is arranged to supply a mixture gas, which comprises a doping gas for doping the thin film with an impurity and a dilution gas for diluting the doping gas, into the process container 4. Further, a purge gas supply circuit 50 is connected to the mixture gas supply circuit 45. The purge gas supply circuit 50 is arranged to supply an inactive gas used as a purge gas into the process container 4.

In this embodiment, the source gas is a silane family gas, such as $SiCl_4$. The deoxidizing gas is hydrogen ($H_2$) gas. The doping gas is a gas for doping with phosphorous, such as $PH_3$ gas. The dilution gas and purge gas are nitrogen ($N_2$) gas. The dilution gas and purge gas may be another inactive gas, such as Ar or He, in place of nitrogen.

Specifically, the gas nozzles 42A and 44A of the source gas supply circuit 42 and deoxidizing gas supply circuit 44 are connected to a source gas source 42S and a deoxidizing gas source 44S through a doping gas supply line 52 and a deoxidizing gas supply line 54 (gas passages), respectively. The gas lines 52 and 54 are provided with switching valves 52A and 54A and flow rate controllers 52B and 54B, such as mass flow controllers, respectively. With this arrangement, the source gas and deoxidizing gas can be supplied at controlled flow rates.

The gas nozzle 45A of the mixture gas supply circuit 45 is connected to a gas mixture tank 66 outside the process container 4 through a mixture gas supply line (gas passage) 64. The gas line 64 is provided with a switching valve 64A. The gas mixture tank 66 has a certain volume to mix the doping gas with the dilution gas, thereby forming the mixture gas. The gas mixture tank 66 has a volume within a range of, e.g., 200 to 5,000 cc, depending on the volume of the process container 4. Particularly, where the process container 4 is arranged to accommodate 50 to 100 wafers of 300 mm, the volume of the gas mixture tank 66 is set to be within a range of 600 to 700 cc. If the volume of the gas mixture tank 66 is less than 200 cc, it is difficult to prepare a sufficient amount of mixture gas necessary for film formation. If the volume of the gas mixture tank 66 is larger than 5,000 cc, the entire apparatus becomes undesirably large.

A doping gas supply circuit 46 and a dilution gas supply circuit 48 are connected to the gas mixture tank 66. The doping gas supply circuit 46 and dilution gas supply circuit 48 respectively includes a doping gas source 56 and a dilution gas source 60 connected to the gas mixture tank 66 through a doping gas supply line 58 and a dilution gas supply line 62 (gas passages). The doping gas source 56 stores a pure doping gas without a dilution gas. The gas lines 58 and 62 are provided with switching valves 58A and 62A and flow rate controllers 58B and 62B, such as mass flow controllers, respectively. With this arrangement, the doping gas and dilution gas can be supplied at controlled flow rates. The gas lines 58 and 62 are combined to be a merged gas line (merged gas passage) 63 connected to the gas mixture tank 66. However, the gas lines 58 and 62 may be separately connected to the gas mixture tank 66.

The gas line 64 of the mixture gas supply circuit 45 is also used as a gas passage for the purge gas supply circuit 50. For this, a portion of the gas line 64 downstream from the switching valve 64A is connected to a purge gas source 50A through a purge gas supply line (a gas passage) 68. The gas line 68 is provided with a switching valve 68A and a flow rate controller 68B, such as a mass flow controller. With this arrangement, the purge gas can be supplied at a controlled flow rate.

The switching valves 52A, 54A, 64A, 68A, 58A, and 62A are operated to be opened and closed, by a gas supply controller 70 formed of, e.g., a microcomputer. The gas mixture tank 66 is provided with a pressure meter 72 for measuring the internal pressure, which outputs pressure measurement values to the gas supply controller 70 in real time. The gas supply controller 70 can calculate the volume of the doping gas in real time, based on the flow rate ratio between the doping gas and dilution gas, and the pressure measurement value.

The film formation apparatus 2 further includes a main control section 80 formed of, e.g., a computer, to control the entire apparatus including the gas supply controller 70. The main control section 80 can control the film formation process described below in accordance with the process recipe of the film formation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 80 can control the gas supply controller 70, exhaust system 14, elevating mechanism 34, heater 38, and so forth, based on the stored process recipe and control data.

Next, an explanation will be given of a film formation method according to an embodiment of the present invention, performed in the film formation apparatus 2 described above. The method according to this embodiment is characterized in that the source gas, deoxidizing gas, and mixture gas of the doping gas and dilution gas are respectively supplied into the process container 4 intermittently (pulse-wise). As a consequence, a thin film with a thickness of an atomic layer level or molecular level is repeatedly formed to deposit a poly-crystalline silicon film doped with phosphorous. This kind of film formation is also called ALD (Atomic Layer Deposition).

At first, when the film formation apparatus 2 is in a waiting state with no wafers loaded therein, the interior of the process container 4 is kept at a temperature lower than a process temperature. On the other hand, a number of wafers W, e.g. 50 wafers, are transferred into the wafer boat 18 at a normal temperature, which is then moved up from below into the process container 4. Then, the bottom port of the manifold 16 is closed by the lid 26 to airtightly seal the interior of the process container 4.

Then, the interior of the process container 4 is vacuum-exhausted and kept at a predetermined process pressure. At the same time, the power supplied to the heater 38 is increased, so that the wafer temperature is raised and stabilized at a process temperature for film formation. Then, predetermined process gases necessary for each process step are supplied from the respective gas nozzles 42A, 44A, and 45A of the gas supply circuits 42, 44, and 45 at controlled flow rates, into the process container 4. As described above, the gases are supplied intermittently (pulse-wise) by the gas supply controller 70, which controls the switching valves 52A, 54A, 64A, and 68A to perform supply and stop of the gases.

When the film formation process is started, the switching valves 58A and 62A are set open, so that the doping gas and dilution gas or $N_2$ gas are always supplied from the doping gas source 56 and dilution gas source 60. Thus, the doping gas and dilution gas are continuously supplied at a predetermined flow rate ratio into the gas mixture tank 66, and are uniformly mixed with each other within the gas mixture tank 66 to form a mixture gas.

On the other hand, while the doping gas and dilution gas are continuously supplied into the gas mixture tank 66, the gas supply controller 70 operates the switching valve 64A to be opened and closed pulse-wise, so as to supply the mixture gas pulse-wise into the process container 4. Further, in synchronism with the switching valve 64A being opened and closed pulse-wise, the gas supply controller 70 operates the switching valves 52A and 54A to be opened and closed pulse-wise, so as to supply the source gas and deoxidizing gas pulse-wise into the process container 4. Furthermore, in synchronism with the switching valves 52A, 54A, and 64A being opened and closed pulse-wise, the gas supply controller 70 operates the switching valve 58A to be closed and opened pulse-wise, so as to supply the purge gas pulse-wise into the process container 4, in a phase opposite to the mixture gas, source gas, and deoxidizing gas.

Figure 2:
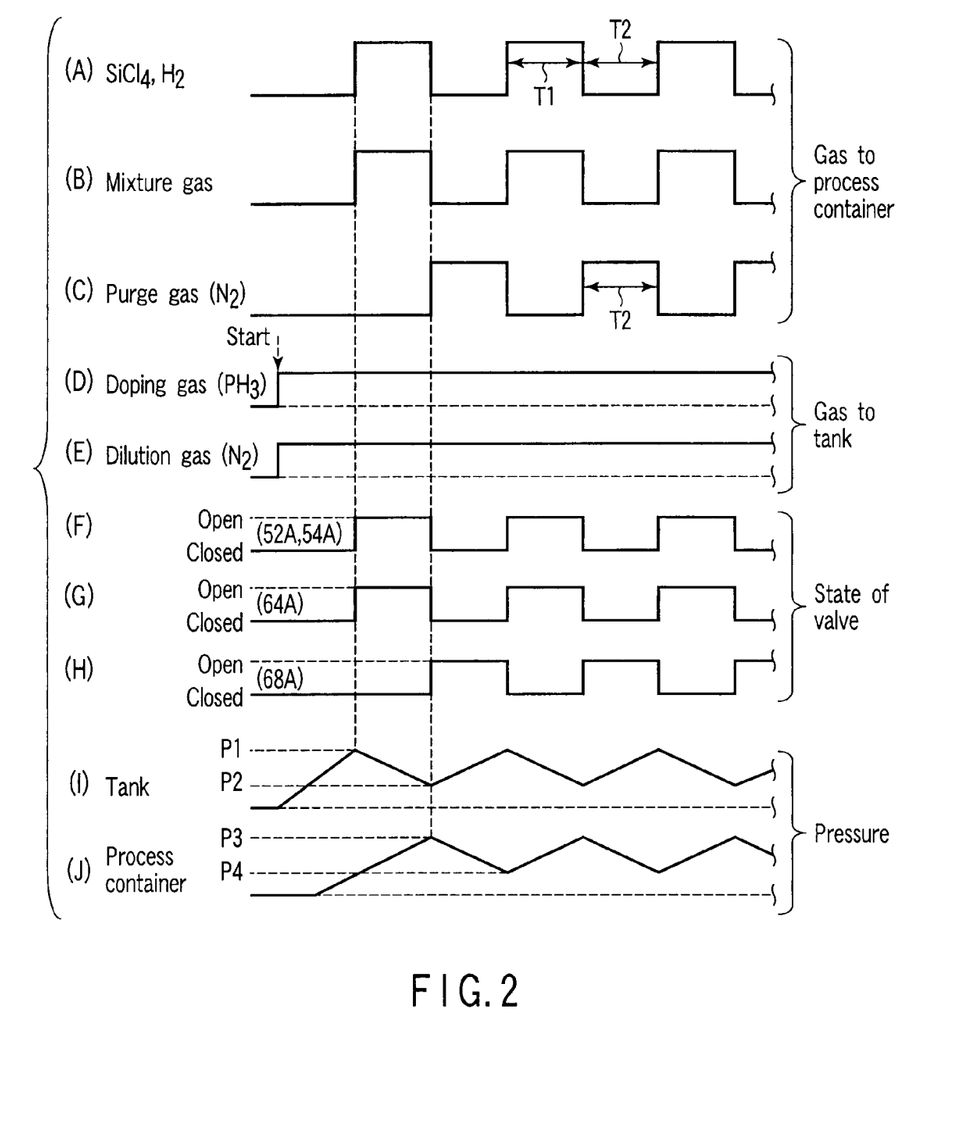
FIG. 2 is a view showing the gas inflow into a process container, the gas inflow into a gas mixture tank, the open and closed states of switching valves, and the pressure inside the gas mixture tank and process container.

FIG. 2 is a view showing the gas inflow into the process container 4, the gas inflow into the gas mixture tank 66, the open and closed states of the switching valves 52A, 54A, 64A, and 68A, and the pressure inside the gas mixture tank 66 and process container 4.

At first, when the film formation process is started, both the switching valves 58A and 62A are set open to start supply of the doping gas or $PH_3$ gas and the dilution gas or $N_2$ gas, which are then uniformly mixed within the gas mixture tank 66 (FIGS. 2, (D) and (E)). At this time, the switching valve 64A is in the closed state, and the mixture gas does not flow out downstream. After a predetermined amount of the mixture gas is stored within the gas mixture tank 66, this mixture gas is intermittently supplied into the process container 4 (FIG. 2, (B)). In synchronism with this supply of the mixture gas, the source gas ($SiCl_4$) and deoxidizing gas ($H_2$) are intermittently supplied into the process container 4 to perform a film formation process (FIG. 2, (A)). When the source gas, deoxidizing gas, and mixture gas are not supplied into the process container 4, the purge gas or $N_2$ gas is supplied into the process container 4, to remove the residual gas (FIG. 2, (C)).

The supply and stop of the gases relative to the process container 4 are performed by the switching valves 52A, 54A, 64A, and 68A being opened and closed, as shown in FIG. 2, (F) to (H). In this case, as shown in FIG. 2, (I), the pressure inside the gas mixture tank 66 is repeatedly varied from around a pressure P1 and to around another pressure P2. Further, the pressure inside the process container 4 is also repeatedly varied from around a pressure P3 to around another pressure P4.

At this time, one supply period T1 of the source gas is set to be within a range of, e.g., about 1 to 180 seconds. One purge period T2 by $N_2$ gas is set to be within a range of, e.g., about 1 to 180 seconds. The film formation temperature is set to be within a range of, e.g., about 300 to 650° C. The film formation pressure is set to be within a range of, e.g., about 26.6 to 1333 Pa. The flow rate of $SiCl_4$ gas is set to be within a range of, e.g., about 200 to 5,000 sccm. The flow rate of $N_2$ gas is set to be within a range of, e.g., about 200 to 5,000 sccm. The flow rate of $PH_3$ gas used as the doping gas is set to be within a range of, e.g., about 0.1 to 1000 sccm. The flow rate of $N_2$ gas used as the dilution gas is set to be within a range of, e.g., about 1 to 5,000 sccm.

In this process, the gas supply controller 70 operates the switching valves 52A, 54A, 64A, and 68A (set the supply pulse widths of the gases) in accordance with a process recipe received from the main control section 80. In this case, the timing of supply and stop of the gases may be obtained by measuring the periods T1 and T2 by a timer.

Alternatively, the timing of supply and stop of the gases may be obtained on the basis of change in the pressure inside the gas mixture tank 66 being monitored by the pressure meter 72. For example, when the gas mixture tank 66 reaches a predetermined pressure P1, the switching valve 64A is opened to start supply of the mixture gas. At this time, an end pressure for stopping the supply is immediately calculated, on the basis of the start pressure P1 and a predetermined supply amount of mixture gas for one pulse. Then, the supply of the mixture gas is maintained, and, when the gas mixture tank 66 reaches the end pressure (a pressure P2 in this case), the switching valve 64A is closed to stop the supply of the mixture gas. In this case, the other switching valves 52A, 54A, and 68A are operated in synchronism with the switching valve 64A being operated.

Further, where the timing of supply and stop of the gases is obtained on the basis of change in the pressure inside the gas mixture tank 66, it may be designed to set the switching valve 64A open for a predetermined time from when the gas mixture tank 66 reaches a predetermined pressure P1. Also in this case, the other switching valves 52A, 54A, and 68A are operated in synchronism with the switching valve 64A being operated.

Figure 3:
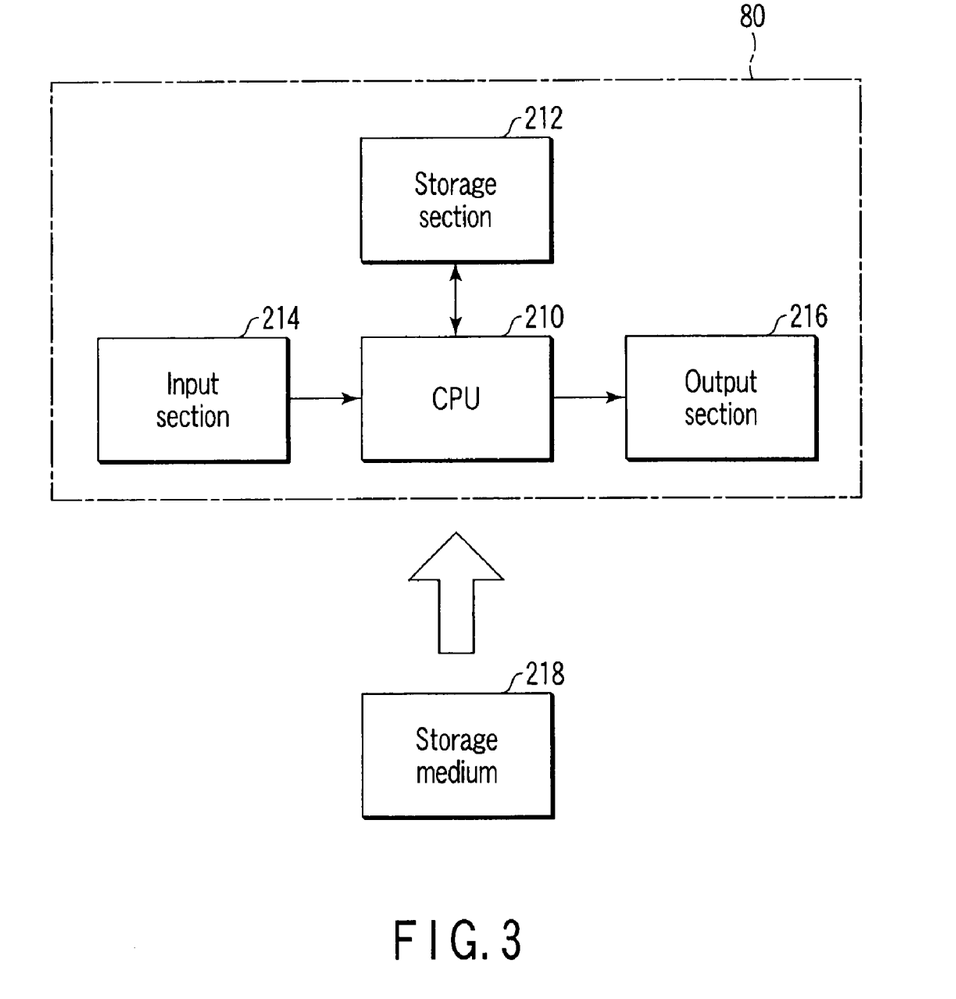
FIG. 3 is a block diagram schematically showing the structure of a main control section.

The method according to the embodiment is performed under the control of the main control section 80 in accordance with a process program, as described above. FIG. 3 is a block diagram schematically showing the structure of the main control section 80. The main control section 80 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 3 also shows a storage medium 218 attached to the computer in a removable state.

The method according to the embodiment may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described above.

According to the embodiment described above, the doping gas source 56 is formed of a cylinder storing a pure doping gas without mixture of a dilution gas. The pure doping gas from this cylinder is supplied into the gas mixture tank 66 and is uniformly mixed with a dilution gas to form a large amount of mixture gas in the tank 66. This mixture gas is then supplied into the process container 4. As a consequence, the diffusion rate of the doping gas within the process container 4 is increased, so that the doping gas is swiftly and uniformly diffused within the process container 4 in a short time. Since the cylinder of the doping gas source 56 stores a pure doping gas, the exchange frequency of the cylinder is reduced, so that the productivity or throughput can be maintained high. In place of a pure gas, the doping gas source 56 may store a doping gas at a high concentration, such as more than 10%, to obtain a certain effect.

The embodiment described above is exemplified by a film formation method of a poly-crystalline silicon film doped with phosphorous. The present invention may be applied to a film formation method of doping a film with another impurity, or forming a film of a different type. For example, the present invention may be applied to a film formation method of forming an SiBN film, using dichlorosilane ($SiH_2Cl_2$) and ammonia ($NH_3$) as source gases and $BCl_3$ as a doping gas. The dilution gas is not limited to an inactive gas, and it can be any gas that causes no problem in use along with the doping gas (preferably a gas used for the film formation). For example, in the case of formation of a SiBN film described above, dichlorosilane used as a source gas for film formation may be also used as a dilution gas. Further, in the case of the apparatus shown in FIG. 1, $SiCl_4$ used as a source gas for film formation may be also used as a dilution gas.

The process container 4 of the heat processing apparatus is not limited to a single-tube structure type shown in FIG. 1, and it may be of a double-tube structure type, for example. A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A method for using a film formation apparatus for a semiconductor process, the apparatus comprising:
   a process container configured to accommodate a plurality of target substrates stacked at intervals;
   a support member configured to support the target substrates inside the process container;
   a heater configured to heat the target substrates inside the process container;
   an exhaust system configured to exhaust gas inside the process container;
   a source gas supply circuit configured to supply a source gas into the process container, the source gas being for depositing a thin film on the target substrates;
   a mixture gas supply circuit configured to supply a mixture gas into the process container, the mixture gas containing a doping gas for doping the thin film with an impurity and a dilution gas for diluting the doping gas; and
   a control section configured to control an operation of the apparatus including the mixture gas supply circuit,
   wherein the mixture gas supply circuit comprises
   a gas mixture tank disposed outside the process container and configured to mix the doping gas with the dilution gas to form the mixture gas,
   a mixture gas supply line configured to supply the mixture gas from the gas mixture tank into the process container,
   a doping gas supply circuit configured to supply the doping gas into the gas mixture tank, and
   a dilution gas supply circuit configured to supply the dilution gas into the gas mixture tank, and
   the method includes performing a film formation process for forming the thin film on the target substrates under control of the control section, the film formation process comprising:
   heating the target substrates stacked at intervals inside the process container;
   supplying the source gas into the process container from a source gas source through the source gas supply circuit; and
   supplying the mixture gas from the gas mixture tank into the process container, while forming the mixture gas by supplying the doping gas and the dilution gas into the gas mixture tank respectively from a doping gas source and a dilution gas source through the doping gas supply circuit and the dilution gas supply circuit,
   wherein the method is preset to perform said supplying the mixture gas by pulse-wise supplying the mixture gas from the gas mixture tank into the process container, while continuously supplying the doping gas and the dilution gas into the gas mixture tank, and to perform said supplying the source gas by pulse-wise supplying the source gas into the process container in synchronism with pulse-wise supplying the mixture gas into the process container,
   wherein said pulse-wise supplying of the mixture gas includes, for each pulse,
      measuring a pressure inside the gas mixture tank by a pressure meter to obtain a pressure measurement value,
      starting supply of the mixture gas from the gas mixture tank when the pressure measurement value reaches a predetermined pressure,
      calculating an end pressure to stop the supply of the mixture gas, based on the predetermined pressure and a predetermined supply amount of the mixture gas for one pulse, while continuing the supply of the mixture gas from the gas mixture tank, and
      stopping the supply of the mixture gas from the gas mixture tank when the pressure measurement value reaches the end pressure.

2. The method according to claim 1, wherein the mixture gas supply circuit includes a merged gas line for the doping gas and the dilution gas from the doping gas supply circuit and the dilution gas supply circuit to be merged therein and then supplied into the gas mixture tank.

3. The method according to claim 1, wherein the gas mixture tank has a volume of 200 to 5,000 cc.

4. The method according to claim 1, wherein the mixture gas supply circuit further comprises a first switching valve disposed on the mixture gas supply line, and the method is preset to pulse-wise open and close the first switching valve while the doping gas and the dilution gas are continuously supplied from the doping gas supply circuit and the dilution gas supply circuit into the gas mixture tank.

5. The method according to claim 4, wherein the mixture gas supply circuit further comprises a pressure meter configured to measure pressure inside the gas mixture tank, and the method is preset to pulse-wise open and close the first switching valve, based on measurement values by the pressure meter.

6. The method according to claim 4, wherein the source gas supply circuit comprises a source gas supply line configured to supply the source gas into the process container, and a second switching valve disposed on the source gas supply line, and the method is preset to pulse-wise open and close the second switching valve in synchronism with operation to pulse-wise open and close the first switching valve.

7. The method according to claim 6, wherein the apparatus further comprises a purge gas supply circuit configured to supply a purge gas into the process container, the purge gas supply circuit comprises a purge gas supply line configured to supply the purge gas into the process container, and a third switching valve disposed on the purge gas supply line, and the method is preset to pulse-wise open and close the third switching valve in synchronism with and in opposite phase with operation to pulse-wise open and close the first and second switching valves.

8. The method according to claim 7, wherein in the apparatus the purge gas supply line is connected to the mixture gas supply line downstream from the first switching valve.

9. The method according to claim 1, wherein the apparatus further comprises a purge gas supply circuit configured to supply a purge gas into the process container, and the method is preset to perform pulse-wise supplying the purge gas into the process container in synchronism with and in opposite phase with pulse-wise supplying the mixture gas and the source gas into the process container.

10. The method according to claim 1, wherein the control section includes a portion configured to calculate a volume of the doping gas inside the gas mixture tank in real time, based on a flow rate ratio between the doping gas and the dilution gas, and pressure inside the gas mixture tank.

11. The method according to claim 1, wherein said pulse-wise supplying the mixture gas includes operating a first switching valve for supplying the mixture gas with reference to the pressure measurement value, and operating a second switching valve for supplying the source gas in synchronism with the first switching valve.

12. The method according to claim 11, wherein the apparatus further comprises a purge gas supply circuit configured to supply a purge gas into the process container, and the method is preset to perform pulse-wise supplying the purge gas into the process container in synchronism with and in opposite phase with pulse-wise supplying the mixture gas and the source gas into the process container, such that said pulse-wise supplying the purge gas includes operating a third switching valve for supplying the purge gas in synchronism with and in opposite phase with the first switching valve.

* * * * *